United States Patent
Goh et al.

(10) Patent No.: US 6,225,225 B1
(45) Date of Patent: May 1, 2001

(54) METHOD TO FORM SHALLOW TRENCH ISOLATION STRUCTURES FOR BORDERLESS CONTACTS IN AN INTEGRATED CIRCUIT

(75) Inventors: Kenny Hua Kooi Goh, Kuala Sepetang (MY); Lap Chan, San Francisco, CA (US); Kok Siong Yap, Singapore (SG)

(73) Assignees: Chartered Semiconductor Manufacturing Ltd.; National University of Singapore; Nanyang Technological University of Singapore, all of Singapore (SG)

( * ) Notice: Subject to any disclaimer, the term of this patent is extended or adjusted under 35 U.S.C. 154(b) by 0 days.

(21) Appl. No.: 09/392,395

(22) Filed: Sep. 9, 1999

(51) Int. Cl.[7] ..................................................... H01L 21/00
(52) U.S. Cl. ........................... 438/692; 438/745; 438/753
(58) Field of Search ................................... 438/691, 692, 438/693, 740, 745, 751, 753, 756, 757, 221; 216/38, 88, 89, 91

(56) References Cited

U.S. PATENT DOCUMENTS

| | | | |
|---|---|---|---|
| 5,268,330 | 12/1993 | Givens et al. | 437/195 |
| 5,466,636 | 11/1995 | Cronin et al. | 437/187 |
| 5,674,781 | 10/1997 | Huang et al. | 437/192 |
| 5,821,153 | 10/1998 | Tsai et al. | 438/439 |
| 6,080,664 * | 6/2000 | Huang et al. | 438/745 X |

\* cited by examiner

*Primary Examiner*—William Powell
(74) *Attorney, Agent, or Firm*—George O. Saile; Rosemary L. S. Pike

(57) ABSTRACT

A method of forming shallow trench isolation trenches for use with borderless contacts is achieved. A silicon nitride layer protects the shallow trench oxide layer from overetch damage. A silicon substrate is provided. A pad oxide layer is grown. A polishing stop layer, of polysilicon or silicon nitride, is deposited. The polishing stop layer, pad oxide layer, and silicon substrate are patterned to form the shallow trenches. A trench oxide layer is deposited to fill the shallow trenches. The trench oxide layer is polished down with the polishing stop layer as a polishing stop. The trench oxide layer is etched down to a level below that of the pad oxide layer. A silicon nitride layer is deposited. A polishing layer of oxide is deposited. The polishing layer and the silicon nitride layer are polished down with the polishing stop layer as a polishing stop. The polishing stop layer is etched away. The silicon nitride layer is etched to remove vertical sidewalls. The polishing layer and the pad oxide layer are etched away with the silicon nitride layer as etching stop to complete the shallow trench isolations.

20 Claims, 5 Drawing Sheets

METHOD TO FORM SHALLOW TRENCH ISOLATION STRUCTURES FOR BORDERLESS CONTACTS IN AN INTEGRATED CIRCUIT

BACKGROUND OF THE INVENTION (1) Field of the Invention

The invention relates to a method of fabricating silicon structures, and more particularly, to the formation of shallow trench isolations for use with borderless contacts in integrated circuit devices.

(2) Description of the Prior Art

In the art, there are two conventional methods for forming such isolation regions. First, a thick layer of silicon oxide may be grown into the surface of the substrate through the process known as local oxidation of silicon (LOCOS). Second, trenches may be etched into the substrate surface and then filled with silicon oxide. This method is called shallow trench isolation (STI).

Although LOCOS has long been the most prevalent technique used to form isolation regions between active areas, recently, shallow trench isolation has gained popularity. Although most STI approaches require more processing steps than LOCOS, the use of STI is growing because of two distinct advantages. First, STI can allow for the formation of narrower isolation regions. Second, STI structures have a flatter topology. Both of these advantages facilitate greater device and interconnect density for integrated circuit devices.

Doped junctions are formed in the silicon substrates of integrated circuit devices in the active areas between the isolation regions. Traditionally, in the art, contacts to these doped junctions in the silicon substrate have required a substantial area penalty. Design rules require that the active areas significantly overlap the contact openings. This large overlap guarantees that the contact etch does not etch any of the field isolation oxide. Damage to the field oxide adjacent to the doped junction could result in excessive leakage currents and reduced device yield. In addition, the topology of the field oxide regions poses problems with the metal layer fill of the contact opening, and subsequently, with the contact resistance.

With the advent of the use of shallow trench isolations (STI), it is possible to reduce the spaces between active devices. In addition, to further reduce the area used for each integrated circuit device, another technique, called borderless contacts, has become increasing useful in the art. In a borderless contact, the contact opening actually extends beyond the edge of the device active area and over the shallow trench isolation.

Referring to FIG. 1, a cross-section of a partially completed prior art integrated circuit is shown. Trenches have been etched in a silicon substrate 10. The trenches have been filled with silicon oxide 14 and planarized to form shallow trench isolations.

Referring to FIG. 2, a typical MOSFET transistor has been formed with a gate electrode 18 and source-drain junctions 22. An interlevel dielectric layer 26 has been deposited overlying the substrate and the MOSFET transistor. The interlevel dielectric layer 26 is typically comprised of a silicon oxide based material.

Referring to FIG. 3, contact openings have been etched in the interlevel dielectric layer 26 for the source and drain junctions 22. Note how the contact openings extend out from the junctions 22 and overlap the shallow trench isolations. Such a placement of the contact openings illustrates the concept of the borderless contact.

The illustration of FIG. 3 also shows a common problem in the art. The contact etch is typically a reactive ion etch (RIE) specific to silicon oxide. Unfortunately, both the interlevel dielectric and the shallow trench isolation are composed of silicon oxide. It is essential to completely etch the contact opening so that there are no contact resistance problems. Unfortunately, it is difficult to completely etch the contact opening without also over etching a portion of the shallow trench isolation 30.

Referring to FIG. 4, after the barrier layer 34 and metal layer 38 are deposited and the contacts are defined, the circuit is completed. Where such over etching 30 occurs, a potential source of junction leakage currents exists. Such leakage currents can significantly reduce device yield.

Several prior art approaches deal with over etch problems and with borderless contacts. U.S. Pat. No. 5,821,153 to Tsai et al discloses a process to reduce LOCOS field oxide etch loss by forming an oxynitride layer over and under the field oxide. U.S. Pat. No. 5,268,330 to Givens et al teaches a method to improve transistor gate sheet contact resistance. A silicon nitride layer is deposited overlying the transistor and acts as an etch back stop during intermetal dielectric planarization. A borderless contact is also disclosed where a silicon nitride layer must be etched through to contact source and drain junctions. However, the silicon nitride layer does not prevent shallow trench isolation oxide loss during the contact etch. U.S. Pat. No. 5,466,636 to Cronin et al discloses a method to form borderless contacts where a removable mandrel is used to protect regions. In this invention, the mandrel layer is formed after transistor definition. U.S. Pat. No. 5,674,781 to Huang et al teaches a borderless contact process. U.S. Pat. No. 6,165,871 to L. E. Hur et al issued on Dec. 26, 2000 teaches a process for forming a self-aligned nitride spacer which acts as an etch stop for borderless contact formation.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolation structures that use a silicon nitride cap to inhibit trench oxide loss during the borderless contact etch process.

A yet further object of the present invention is to implement the silicon nitride capping process while maintaining a flat shallow trench isolation topology.

In accordance with the objects of this invention, a new method of fabricating shallow trench isolations for use with borderless contacts has been achieved. A silicon substrate is provided. A pad oxide layer is grown overlying the silicon substrate. A polishing stop layer, of either polysilicon or silicon nitride, is deposited overlying the pad oxide layer. The polishing stop layer, pad oxide layer, and silicon substrate are patterned to form shallow trenches. A trench oxide layer is deposited overlying the polishing stop layer and completely filling the shallow trenches. The trench oxide layer is polished down to the top surfaces of the polishing stop layer. The trench oxide layer is etched down to a level below that of the pad oxide layer. A silicon nitride layer is deposited overlying the polishing stop layer and the trench oxide layer. A polishing layer of oxide is deposited overlying the silicon nitride layer. The polishing layer and the silicon nitride layer are polished down to the top surfaces of the polishing stop layer wherein the polishing layer protects the silicon nitride layer overlying the trench oxide layer from the polishing step. The polishing stop layer is etched away. The silicon nitride layer is etched to remove the part of the silicon nitride layer forming vertical sidewalls to the polishing layer. The polishing layer and the pad oxide layer are etched away where the remaining silicon nitride layer acts as an etching stop and protects the underlying trench oxide layer and where the etching away completes the shallow trench isolations. Ions are implanted into the silicon substrate where defined by masking features to form doped junctions wherein the doped junctions so formed are adjacent to the shallow trench isolations. An interlevel dielectric layer is deposited overlying the shallow trench isolations and the doped junctions. The interlevel dielectric layer is etched through where not protected by a photoresist mask and thereby forms contact openings for planned borderless contacts wherein the contact openings expose both a part of the doped junctions and a part of the adjacent shallow trench isolations. A barrier layer is deposited overlying the interlevel dielectric layer and the interior surfaces of the contact openings. A metal layer is deposited overlying the barrier layer and completely filling the contact openings to form the borderless contacts, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
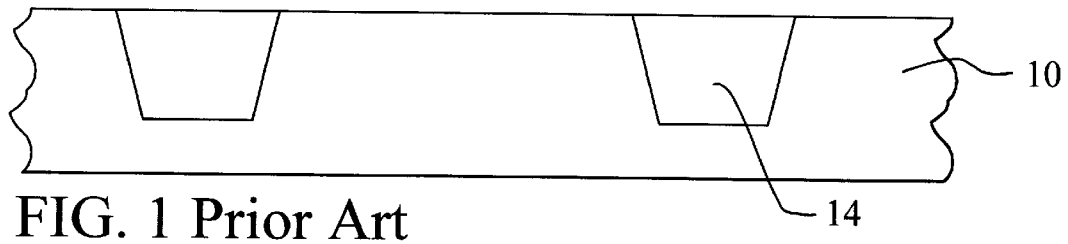
FIGS. 1 through 4 schematically illustrate in cross-section a partially completed prior art shallow trench isolation used with a borderless contact in an integrated circuit device.
Figure 2:
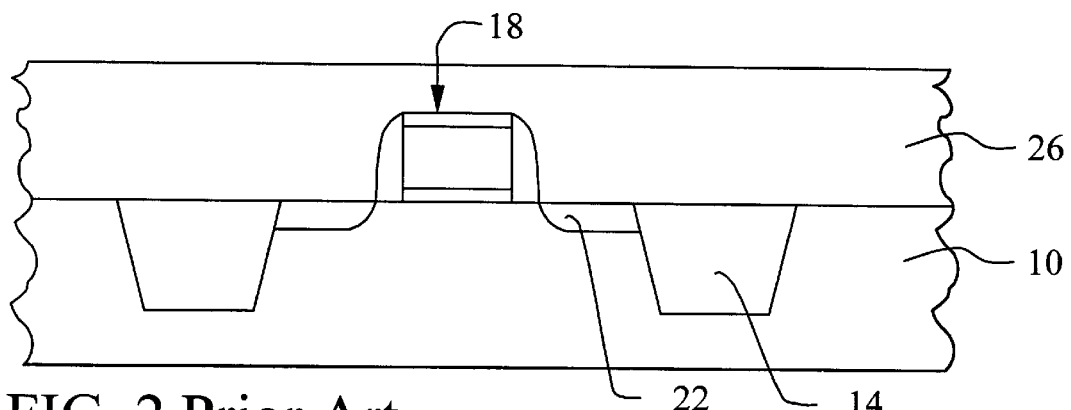
Figure 3:
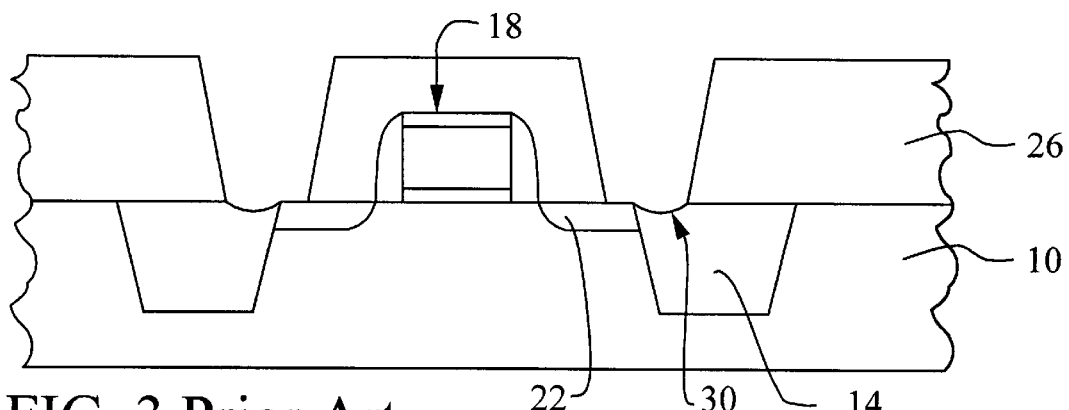
Figure 4:
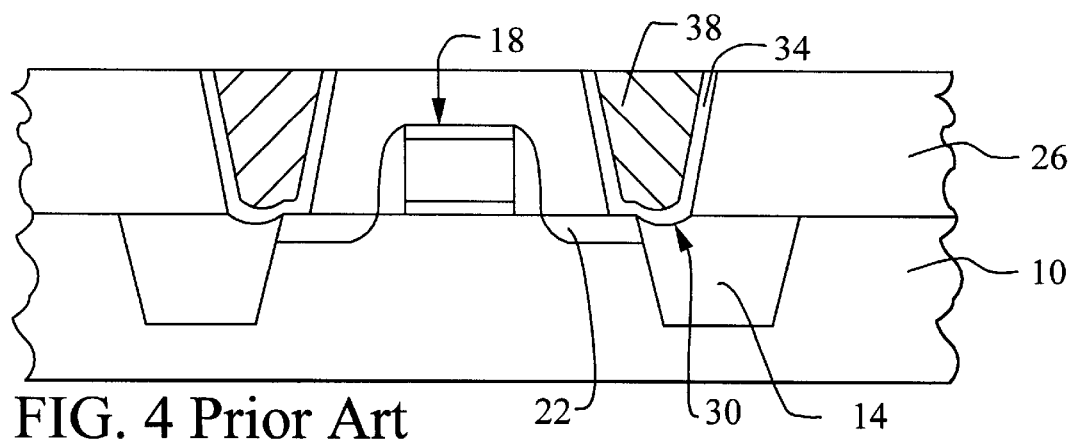
Figure 5:
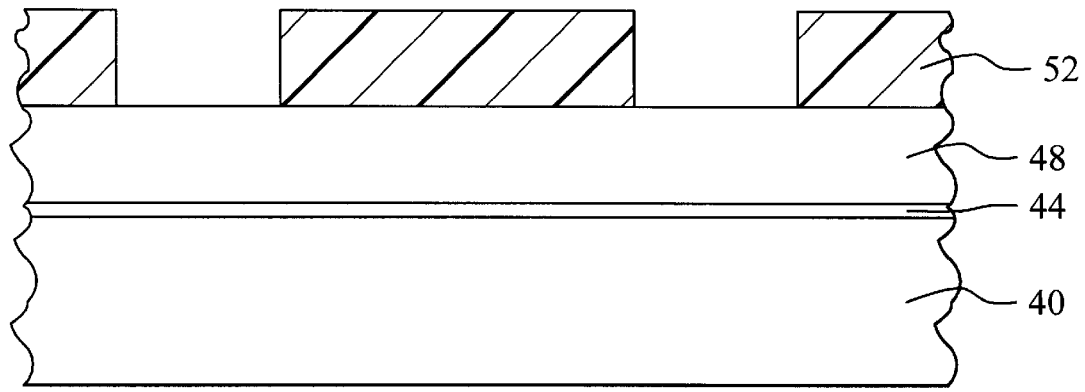
FIGS. 5 through 15 schematically illustrate in cross-sectional representation a preferred embodiment of the present invention.

Referring now more particularly to FIG. 5, there is illustrated a cross section of a partially completed integrated circuit device. The silicon substrate 40 is preferably composed of monocrystalline silicon. A pad oxide layer 44 is grown overlying the silicon substrate 40. The pad oxide layer 44 is preferably composed of silicon dioxide that improves the adhesion of the subsequent layers to the surface of the substrate 40 while relieving potential surface stress. In the preferred embodiment, the pad oxide layer 44 is grown to a thickness of between about 100 Angstroms and 500 Angstroms.

A polishing stop layer 48 is deposited overlying the pad oxide layer 44. The polishing stop layer 48 comprises either polysilicon or silicon nitride. The polishing stop layer 48 is deposited using a conventional low pressure chemical vapor deposition (LPCVD) process to a thickness of between about 1000 Angstroms and 2000 Angstroms. This is an important aspect of the present invention as the polishing stop layer 48 is used as a polishing stop in the processing sequence.

The polishing stop layer 48, the pad oxide layer 44, and the silicon substrate 40 are patterned to form shallow trenches. This patterning is performed by methods well known in the art. For example, a photoresist layer 52 is applied overlying the polishing stop layer 48. The photoresist layer 52 is developed using conventional photolithography and then removed in areas where the shallow trenches are planned.

Figure 6:
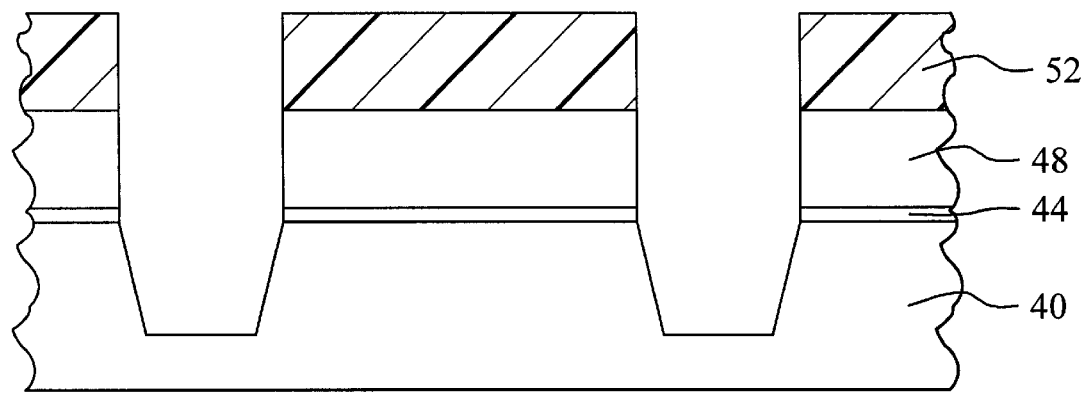

Referring now to FIG. 6, the polishing stop layer 48, pad oxide layer 44, and silicon substrate 40 are etched where not protected by the photoresist layer 52 to form the shallow trenches. A reactive ion etch (RIE) using an etching chemistry of $Cl_2$, HBr, He, and $O_2$ is used to etch the shallow trenches. The remaining photoresist layer 52 is then stripped away.

Figure 7:
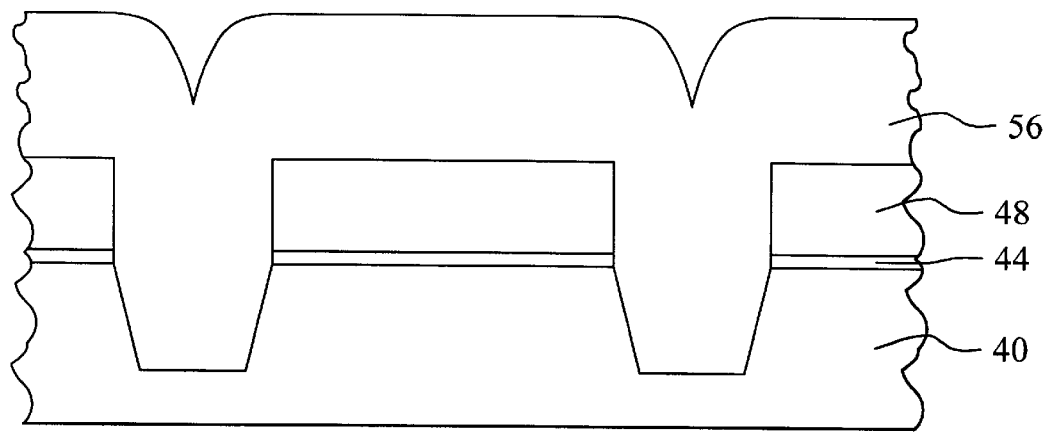

Referring now to FIG. 7, a trench oxide layer 56 is deposited overlying the polishing stop layer 48 and completely filling the shallow trenches. The trench oxide layer 56 is preferably composed of a silicon oxide deposited either by a low pressure tetraethyloxysilane (TEOS) process or by a high density plasma (HDP) process. The trench oxide layer 56 so formed has a thickness of between about 5000 Angstroms and 12,000 Angstroms.

Figure 8:
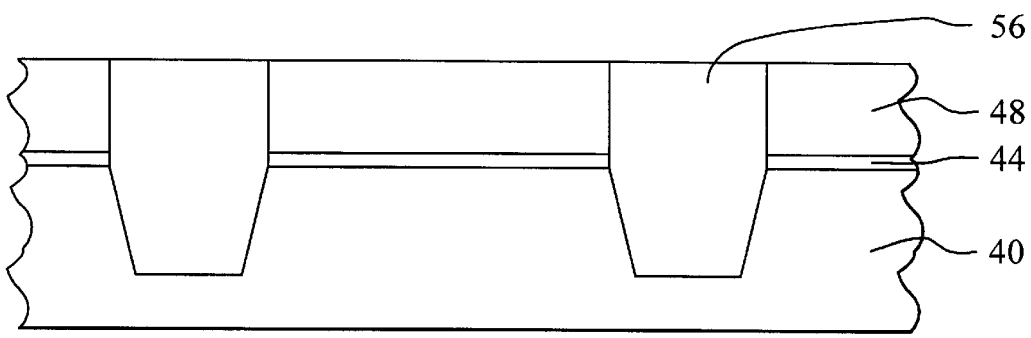

Referring to FIG. 8, another important feature of the present invention is shown. The trench oxide layer 56 is polished down to the top surfaces of the polishing stop layer 48. The key polishing stop layer 48 acts as a polishing stop for this step. The polishing down is preferably accomplished by a chemical mechanical polish operation.

Figure 9:
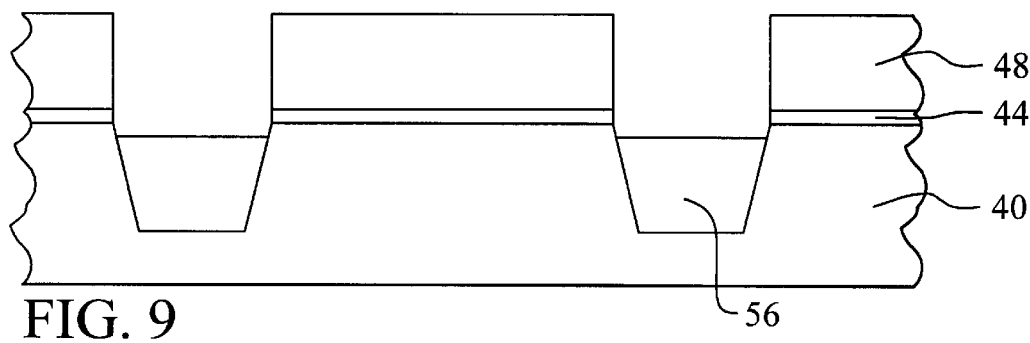

Referring now to FIG. 9, another key feature of the present invention is shown. The trench oxide layer 56 is etched down to a level below that of the pad oxide layer 44. In this etch, the trench oxide layer 56 is etched using a conventional wet etch process comprising either buffered oxide etchant (BOE) using $NH_4F{:}HF$ or dilute HF (for example 10:1). It is important that the trench oxide layer 56 be etched to a level below that of the pad oxide layer 44 so that, when the shallow trench isolation is completely formed, the top surface of the STI will be at about the same height as the surface of the silicon substrate 40.

Figure 10:
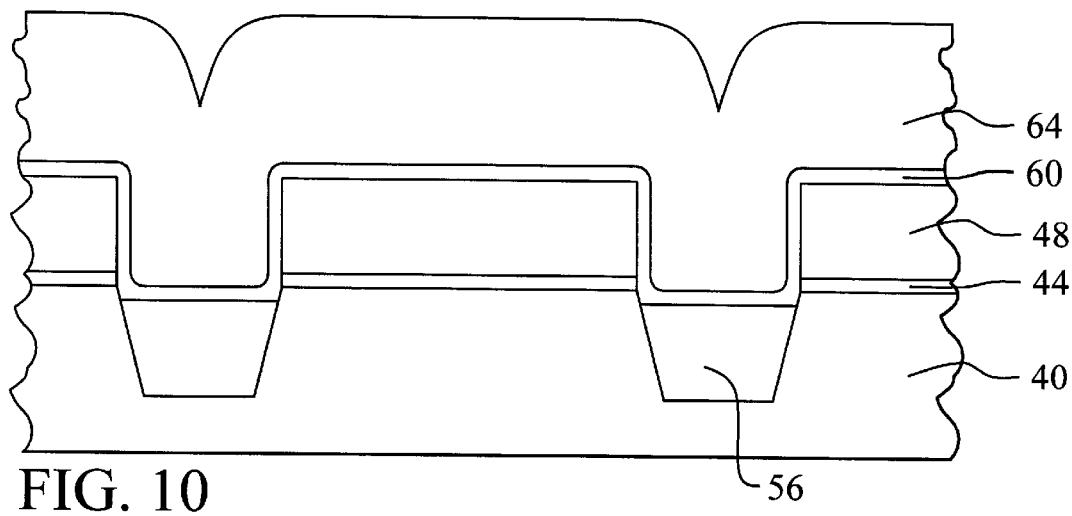

Referring now to FIG. 10, a silicon nitride layer 60 is deposited overlying the polishing stop layer 48 and the trench oxide layer 56. This silicon nitride layer 60 is key to the present invention. In subsequent processing, the silicon nitride layer 60 is further defined to overlay only the trench oxide layer 56 in the shallow trench. The silicon nitride layer 60 will thus form a protective etching stop for subsequent oxide etch steps. The silicon nitride layer 60 is deposited by a chemical vapor deposition (CVD) process to a thickness of between about 500 Angstroms and 800 Angstroms.

A polishing layer 64 of oxide is deposited overlying the silicon nitride layer 60. The purpose of the polishing layer 64 is to allow a portion of the silicon nitride layer 60 to be removed by a chemical mechanical polishing step while protecting the key portion of the silicon nitride layer 60 that overlies the shallow trench isolation. In the preferred embodiment, the polishing layer 64 is composed of a silicon oxide deposited by a low pressure CVD or plasma enhanced tetraethyloxysilane (TEOS) process. The polishing layer 64 so formed has a thickness of between about 2000 Angstroms and 6000 Angstroms.

Figure 11:
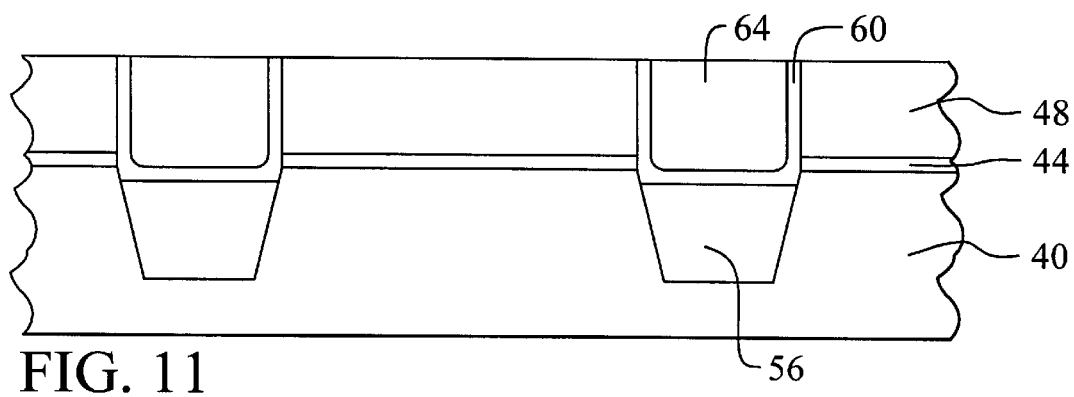

Referring now to FIG. 11, the polishing layer 64 and the silicon nitride layer 60 are polished down to the top surfaces of the polishing stop layer 48. This step in the process of the present invention is key because the polishing stop layer 48 acts as a polishing stop. Consequently, the part of the silicon nitride layer 60 that overlies the polishing stop layer 48 is removed by the polishing step. However, the part of the silicon nitride layer 60 that overlies the shallow trench isolation region is protected from the polishing step by the polishing layer 64. The polish step is performed using a conventional chemical mechanical polish operation.

Figure 12:
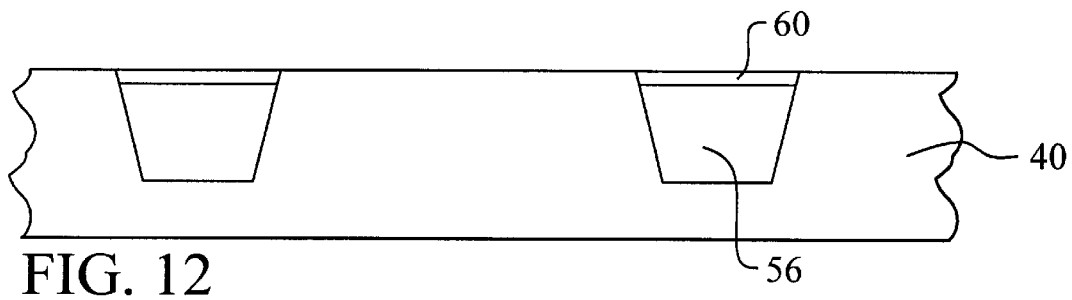

Referring now to FIG. 12, the polishing stop layer 48 is etched away. If the polishing stop layer 48 is polysilicon, it is etched using a conventional wet etch of KOH. If the polishing stop layer 48 comprises silicon nitride, then hot phosphoric acid ($H_3PO_4$) is used.

The silicon nitride layer 60 is etched to remove the part of the silicon nitride layer 60 forming vertical sidewalls to the polishing layer 64. The silicon nitride layer 60 etch is performed using a wet etch process comprising hot phosphoric acid ($H_3PO_4$). The presence of the polishing layer 64 protects the lateral portion of the silicon nitride layer 60 from the wet etch step.

The polishing layer 64 and the pad oxide layer 44 are etched away. The remaining silicon nitride layer 60 acts as an etching stop and protects the underlying trench oxide layer 56. The step of etching away completes the shallow trench isolations. The etching step is performed using a conventional wet etch process comprising buffered oxide etchant (BOE) using $NH_4F$:HF. As can be seen from the illustration, the completed shallow trench isolation not only features a protective silicon nitride layer 60, but also is relatively level with the top surface of the silicon substrate 40 to enhance the integration of subsequent process steps.

Figure 13:
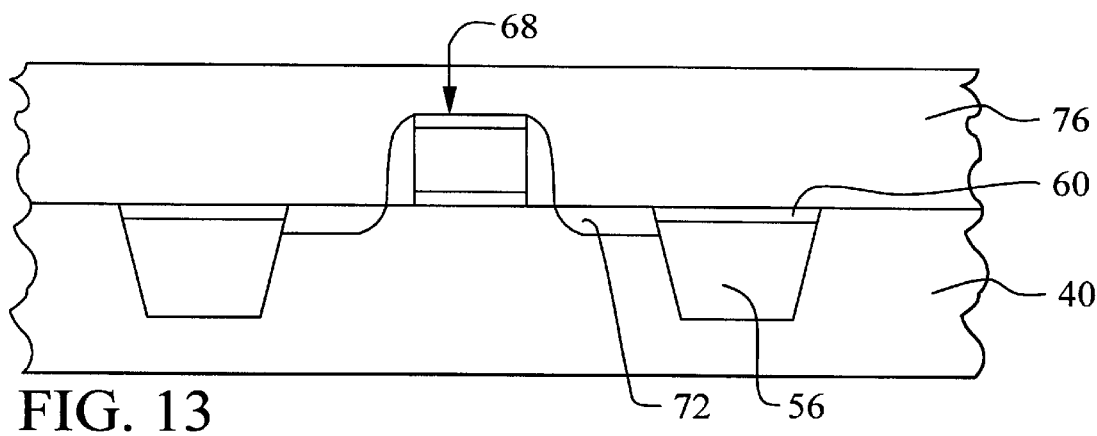

Referring now to FIG. 13, the steps necessary to form the borderless contact structure are disclosed. In the example embodiment, a MOSFET transistor gate electrode 68 is formed by conventional processes. Ions are implanted into the silicon substrate 40 where defined by masking features to form doped junctions 72, such as drains and sources associated with the gate electrode 68. These doped junctions 72 so formed are adjacent to the silicon nitride layer 60 covering the shallow trench isolations. An interlevel dielectric layer 76 is deposited overlying the shallow trench isolations and the doped junctions 72. The interlevel dielectric layer 76 is typically composed of a silicon oxide based material.

Figure 14:
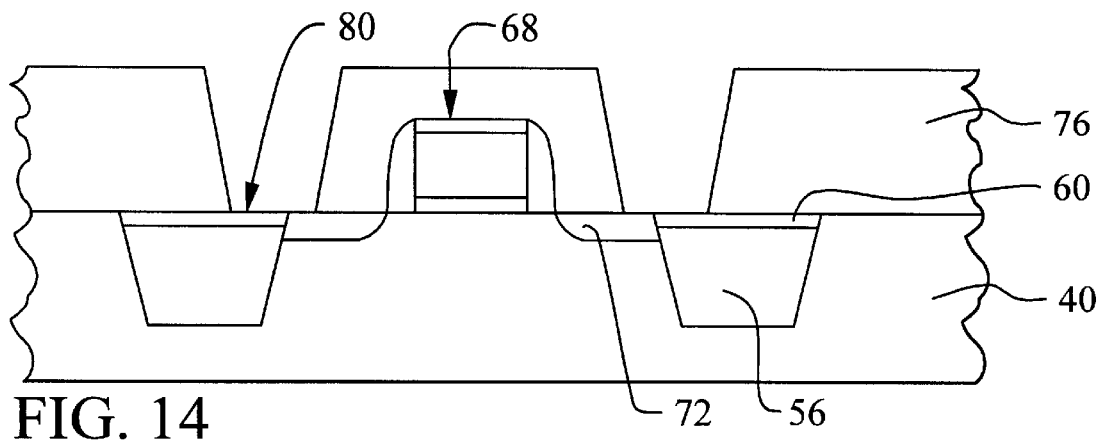

Referring now to FIG. 14, the interlevel dielectric layer 76 is etched through where not protected by a photoresist mask, which is not shown. This etching step forms contact openings for planned borderless contacts. Because borderless contacts are intended, the contact openings expose both a part of the doped junctions 72 and a part of the adjacent shallow trench isolations. The interlevel dielectric layer 76 etch is performed using a reactive ion etch (RIE) comprising a chemistry of $C_4F_8$, CO, $CO_2$, and Ar or $CHF_3$, $CF_4$, and $O_2$.

It is at this point in the process that the advantage of the present invention becomes clear. Because the interlevel dielectric layer 76 is composed of a silicon oxide based material, the etching process could cause the over etching damage to the trench oxide layer 56, just as was the case in the prior art. However, because the silicon nitride layer 60 overlies the trench oxide layer 56, the trench oxide layer 56 is protected and no damage occurs in the shallow trench isolation region 80.

Figure 15:
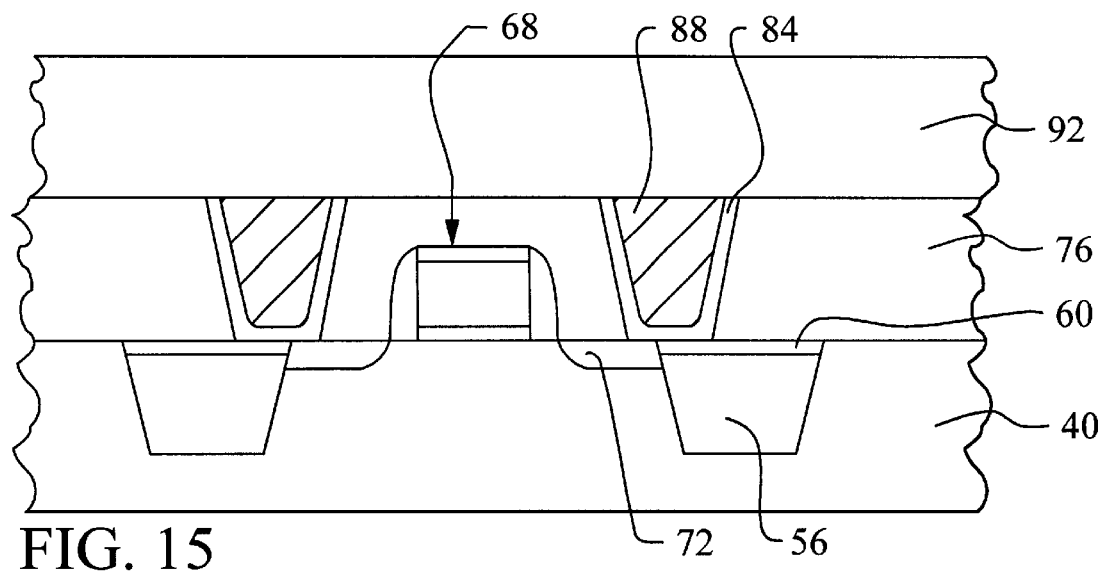

Referring to FIG. 15, a barrier layer 84 is deposited overlying the interlevel dielectric layer 76 and the interior surfaces of the contact openings. A metal layer 88, composed typically of copper or tungsten, is deposited overlying the barrier layer and completely filling the contact opening to form the contact. The metal layer 88 and the barrier layer 84 are then polished down to the top surfaces of the interlevel dielectric layer 76 to define plugs. A passivation layer 92, typically composed of plasma nitride, is deposited overlying the interlevel dielectric layer 76 and the contacts to complete the integrated circuit device.

The presence of the silicon nitride layer 60 overlying the shallow trench isolation protects the trench oxide layer 56 from etching damage. The resulting borderless contact does not exhibit etch damage or excessive leakage currents in the problem area.

As shown in the preferred embodiment, the present invention provides a very manufacturable process for fabricating the shallow trench isolations for use with borderless contacts in the manufacture of integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation in the fabrication of an integrated circuit device comprising:

provided a pad oxide layer overlying a silicon substrate;

depositing a polishing stop layer overlying said pad oxide layer;

patterning said polishing stop layer, said pad oxide layer, and said silicon substrate to form shallow trenches;

depositing a trench oxide layer overlying said polishing stop layer and completely filling said shallow trenches;

polishing down said trench oxide layer to the top surfaces of said polishing stop layer;

etching down said trench oxide layer to a level below that of said pad oxide layer;

thereafter depositing a silicon nitride layer overlying said polishing stop layer and said trench oxide layer;

depositing a polishing layer overlying said silicon nitride layer;

polishing down said polishing layer and said silicon nitride layer to said top surfaces of said polishing stop layer wherein said polishing layer protects said silicon nitride layer overlying said trench oxide layer and on sidewalls of said polishing layer from said polishing down;

etching away said polishing stop layer;

etching away said silicon nitride sidewalls; and etching away said polishing layer and said pad oxide layer where said silicon nitride layer overlying said trench oxide layer acts as an etching stop and protects underlying said trench oxide layer to complete said formation of said shallow trench isolation in the fabrication of said integrated circuit device.

2. The method according to claim 1 wherein said polishing stop layer comprises polysilicon deposited to a thickness of between about 1000 Angstroms and 2000 Angstroms.

3. The method according to claim 1 wherein said polishing stop layer comprises silicon nitride deposited to a thickness of between about 1000 Angstroms and 2000 Angstroms.

4. The method according to claim 1 wherein said step of etching down said trench oxide layer is by a wet etch comprising a chemistry of one of the group of: buffered oxide etchant comprising $NH_4F$:HF and dilute HF.

5. The method according to claim 2 wherein said step of etching away said polishing stop layer is by wet etching chemistry comprising KOH.

6. The method according to claim 3 wherein said step of etching away said polishing stop layer is by wet etching chemistry comprising hot phosphoric acid ($H_3PO_4$).

7. The method according to claim 1 wherein said step of etching away said silicon nitride sidewalls is performed using a wet etch process comprising hot phosphoric acid ($H_3PO_4$).

8. The method according to claim 1 wherein said step of etching away said polishing layer and said pad oxide layer is performed using a wet etch process comprising one of the group of: buffered oxide etchant.

9. A method of forming borderless contacts over shallow trench isolations in the fabrication of an integrated circuit device comprising:

providing a silicon substrate;

growing a pad oxide layer overlying said silicon substrate;

depositing a polishing stop layer overlying said pad oxide layer;

patterning said polishing stop layer, said pad oxide layer, and said silicon substrate to form shallow trenches;

depositing a trench oxide layer overlying said polishing stop layer and completely filling said shallow trenches;

polishing down said trench oxide layer to the top surfaces of said polishing stop layer;

etching down said trench oxide layer to a level below that of said pad oxide layer;

thereafter depositing a silicon nitride layer overlying said polishing stop layer and said trench oxide layer;

depositing a polishing layer overlying said silicon nitride layer;

polishing down said polishing layer and said silicon nitride layer to said top surfaces of said polishing stop layer wherein said polishing layer protects said silicon nitride layer overlying said trench oxide layer and on sidewalls of said polishing layer from said polishing down;

etching away said polishing stop layer;

etching away said silicon nitride sidewalls;

etching away said polishing layer and said pad oxide layer wherein said silicon nitride layer overlying said trench oxide layer acts as an etching stop and protects underlying said trench oxide layer to complete said formation of said shallow trench isolation;

implanting ions into said silicon substrate where defined by masking features to form doped junctions wherein said doped junctions so formed are adjacent to aid shallow trench isolation;

depositing an interlevel dielectric layer overlying said shallow trench isolation and said doped junctions;

etching through said interlevel dielectric layer whereby forming contact openings for planned said borderless contacts wherein said contact openings expose both a part of said doped junctions and a part of said adjacent shallow trench isolation;

depositing a barrier layer overlying said interlevel dielectric layer and the interior surfaces of said contact openings; and depositing a metal layer overlying said barrier layer and completely filling said contact openings to form said borderless contacts to complete formation of said borderless contacts over shallow trench isolation in said fabrication of said integrated circuit device.

10. The method according to claim 9 wherein said polishing stop layer comprises polysilicon deposited to a thickness of between about 1000 Angstroms and 2000 Angstroms.

11. The method according to claim 9 wherein said polishing stop layer comprises silicon nitride deposited to a thickness of between about 1000 Angstroms and 2000 Angstroms.

12. The method according to claim 9 wherein said step of etching down said trench oxide layer is by a wet etching process comprising a chemistry of one of the group of: buffered oxide etchant comprising $NH_4F:HF$ and dilute HF.

13. The method according to claim 10 wherein said step of etching away said polishing stop layer is by wet etching chemistry comprising KOH.

14. The method according to claim 11 wherein said step of etching away said polishing stop layer is by wet etching chemistry comprising hot phosphoric acid ($H_3PO_4$).

15. The method according to claim 9 wherein said step of etching away said silicon nitride layer sidewalls is performed using a wet etch process comprising hot phosphoric acid ($H_3PO_4$).

16. The method according to claim 9 wherein said step of etching away said polishing layer and said pad oxide layer is performed using a wet etch process comprising one of the group of: buffered oxide etchant comprising $NH_4F:HF$ and dilute HF.

17. A method of forming borderless contacts over shallow trench isolations in the fabrication of an integrated circuit device comprising:

providing a silicon substrate;

growing a pad oxide layer overlying said silicon substrate;

depositing a polishing stop layer overlying said pad oxide layer;

patterning said polishing stop layer, said pad oxide layer, and said silicon substrate to form shallow trenches;

depositing a trench oxide layer overlying said polishing stop layer and completely filling said shallow trenches;

polishing down said trench oxide layer to the top surfaces of said polishing stop layer;

etching down said trench oxide layer to a level below that of said pad oxide layer;

thereafter depositing a silicon nitride layer overlying said polishing stop layer and said trench oxide layer;

depositing a polishing layer overlying said silicon nitride layer;

polishing down said polishing layer and said silicon nitride layer to said top surfaces of said polishing stop layer wherein said polishing stop layer protects said silicon nitride layer overlying said trench oxide layer and on sidewalls of said polishing stop layer from said polishing down;

etching away said polishing stop layer;

etching away said silicon nitride sidewalls;

etching away said polishing layer and said pad oxide layer where the remaining said silicon nitride layer acts as an etching stop and protects underlying said trench oxide layer, wherein said etching away completes the shallow trench isolations;

implanting ions into said silicon substrate where defined by masking features to form doped junctions wherein said doped junctions so formed are adjacent to said shallow trench isolations;

depositing an interlevel dielectric layer overlying said shallow trench isolations and said doped junctions;

etching through said interlevel dielectric layer thereby forming contact openings for planned said borderless contacts wherein said contact openings expose both a part of said doped junctions and a part of said adjacent shallow trench isolations;

depositing a barrier layer overlying said interlevel dielectric layer and the interior surfaces of said contact openings; and depositing a metal layer overlying said barrier layer and completely filling said contact openings to complete formation of said borderless contacts in said fabrication of said integrated circuit device.

18. The method according to claim 17 wherein said polishing stop layer has a thickness of between about 1000 Angstroms and 2000 Angstroms.

19. The method according to claim 17 wherein said step of etching away said silicon nitride layer sidewalls is performed using a wet etch process comprising hot phosphoric acid ($H_3PO_4$).

20. The method according to claim 17 wherein said step of etching down said trench oxide layer is by a wet etch comprising a chemistry of one of the group of: buffered oxide etchant comprising $NH_4F$:HF and dilute HF.

* * * * *